United States Patent
Liao

(10) Patent No.: US 10,073,508 B2
(45) Date of Patent: Sep. 11, 2018

(54) POWER SUPPLY DEVICE AND ELECTRONIC DEVICE WITH SAME

(71) Applicant: NANNING FUGUI PRECISION INDUSTRIAL CO., LTD., Nanning (CN)

(72) Inventor: Feng-Liang Liao, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 15/070,879

(22) Filed: Mar. 15, 2016

(65) Prior Publication Data

US 2017/0212564 A1  Jul. 27, 2017

(30) Foreign Application Priority Data

Jan. 23, 2016  (TW) .............. 105102144 A

(51) Int. Cl.
| | |
|---|---|
| G06F 1/26 | (2006.01) |
| G06F 1/20 | (2006.01) |
| H05K 5/02 | (2006.01) |
| H05K 7/00 | (2006.01) |

(52) U.S. Cl.
CPC .............. *G06F 1/26* (2013.01); *G06F 1/20* (2013.01); *H05K 5/02* (2013.01); *H05K 7/00* (2013.01)

(58) Field of Classification Search
None
See application file for complete search history.

(56) References Cited

U.S. PATENT DOCUMENTS

| | | | | |
|---|---|---|---|---|
| 5,825,618 | A * | 10/1998 | Schnoor ............... | H05K 7/1427 361/679.6 |
| 7,471,505 | B2 * | 12/2008 | Gull .................... | H02J 3/38 200/43.16 |
| 7,549,917 | B2 * | 6/2009 | Henry .................. | H05K 7/1445 361/695 |
| 7,652,888 | B2 * | 1/2010 | Bohlinger ............. | G06F 1/181 361/732 |
| 8,385,070 | B2 * | 2/2013 | Huang .................. | H04B 1/036 165/80.2 |
| 8,419,459 | B2 * | 4/2013 | Nihei ................... | H01R 13/5213 439/341 |
| 2004/0127080 | A1 * | 7/2004 | Chen .................... | H01R 13/447 439/172 |
| 2005/0237724 | A1 * | 10/2005 | Fiorentino ........... | H05K 7/1457 361/752 |

(Continued)

FOREIGN PATENT DOCUMENTS

TW  509383  11/2015

*Primary Examiner* — Courtney Smith
(74) *Attorney, Agent, or Firm* — ScienBiziP, P.C.

(57) ABSTRACT

A power supply device includes a housing, a plug assembly, and a sliding assembly. The plug assembly includes a power jack positioned on the housing and a power plug. The sliding assembly is slidably mounted on the housing. When the sliding assembly slides to a first position, the sliding assembly is configured to block the power jack for preventing the power plug being inserted to the power jack. When the sliding assembly slides to a second position, the sliding assembly is configured to move away from the power jack for allowing the power plug being received in the power jack.

14 Claims, 7 Drawing Sheets

(56) References Cited

U.S. PATENT DOCUMENTS

| | | | | |
|---|---|---|---|---|
| 2007/0275774 A1* | 11/2007 | Fagrenius | ........... | H04M 1/0235 455/575.4 |
| 2013/0084722 A1* | 4/2013 | Lin | .................... | H01R 13/4534 439/144 |
| 2015/0082063 A1* | 3/2015 | Peterson | ................. | G06F 13/40 713/323 |

* cited by examiner

US 10,073,508 B2

POWER SUPPLY DEVICE AND ELECTRONIC DEVICE WITH SAME

CROSS-REFERENCE TO RELATED APPLICATIONS

This application claims priority to Taiwanese Patent Application No. 105102144 filed on Jan. 23, 2016, the contents of which are incorporated by reference herein.

FIELD

The subject matter herein generally relates to a power supply device and an electronic device with the same.

BACKGROUND

For many kinds of electronic devices, such as, a computer chassis, a power supply device is needed to supply power to the electronic device.

BRIEF DESCRIPTION OF THE DRAWINGS

Implementations of the present technology will now be described, by way of example only, with reference to the attached figures.

DETAILED DESCRIPTION

Figure 1:
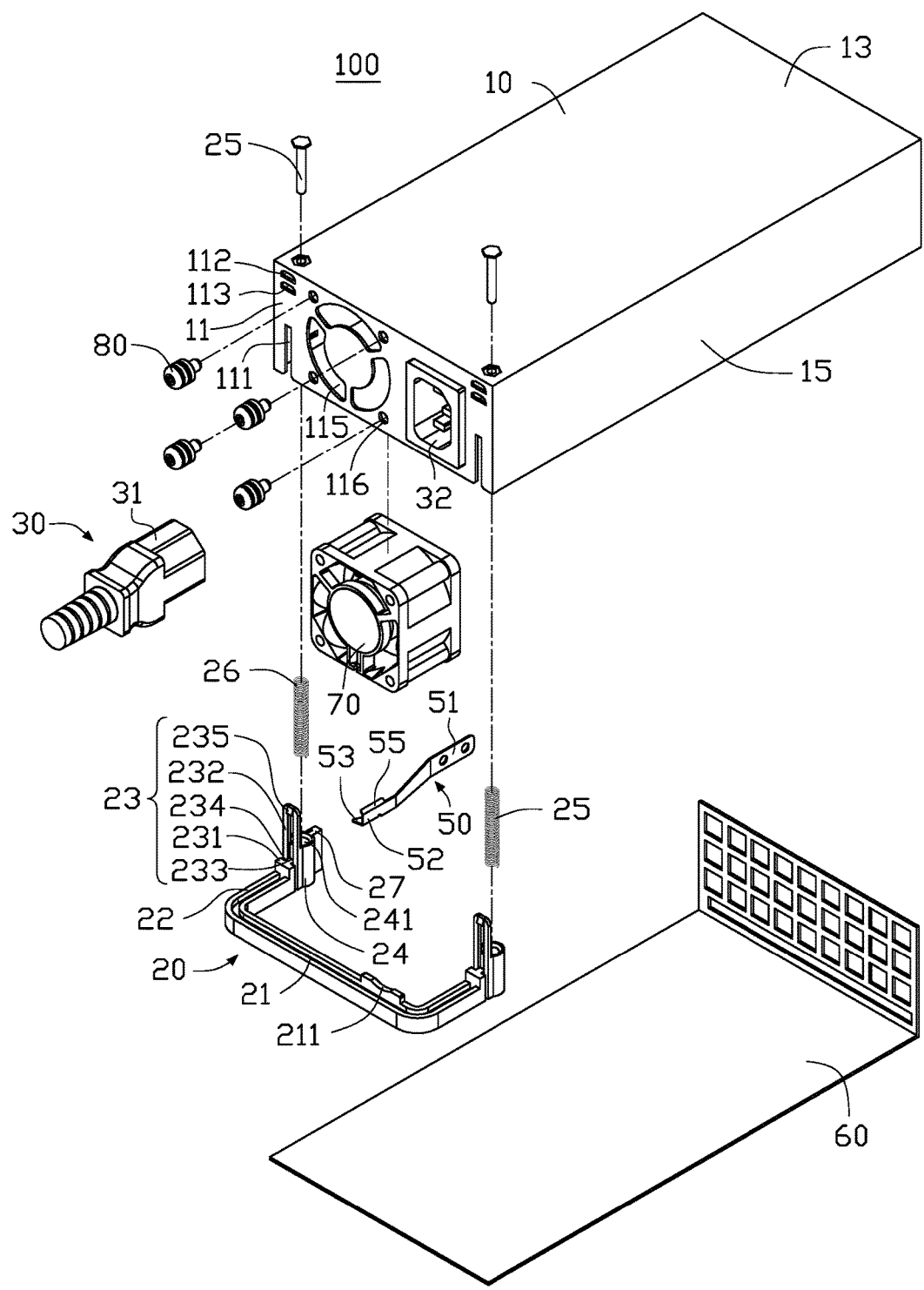
FIG. 1 is an exploded, isometric view of an embodiment of a power supply device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an embodiment of a power supply device 100. The power supply device 100 includes a housing 10, a sliding assembly 20, and a plug assembly 30. The sliding assembly 20 is slidably positioned on the housing 10. The plug assembly 30 includes a power plug 31 and a power jack 32. The power jack 32 is positioned on the housing 10. The power plug 31 can be received in the power jack 32.

The housing 10 is substantially a hollow cubic structure with one end opened. The housing 10 includes an end surface 11, a top surface 13, and two side surfaces 15. The end surface 11 is perpendicularly connected to an edge of the top surface 13. The two side surfaces 13 are positioned parallel to and spaced from each other. The two side surfaces 13 are adjacent to the end surface 11 and are perpendicularly connected to a periphery of the end surface 11 and the top surface 13. The end surface 11 of the housing 10 defines at least one sliding slot 111, at least one first latching slot 112, and at least one second latching slot 113. In at least one embodiment, there are two sliding slots 111. The two sliding slots 111 are positioned at one end of the end surface 11 away from the top surface 13 and are positioned spaced from each other. Each of the sliding slots 111 is substantially rectangular and is defined on one end of the end surface 11 away from the top surface 13 and extends towards the top surface 13. The sliding assembly 20 can be slidably received in the sliding slots 111.

In at least one embodiment, a number of the first latching slots 112 and a number of the second latching slots 113 are both corresponding to a number of the sliding slots 111. That is, there are two first latching slots 112 and two second latching slots 113. The two first latching slots 112 are symmetrically positioned at one end of the end surface 11 adjacent to the top surface 13. Each of the two second latching slots 113 is positioned between one first latching slot 112 and one sliding slot 111 and keeps in a line with the sliding slot 111 and the first latching slot 112. In at least one embodiment, the power jack 32 is positioned on the end surface 11 and is positioned between the two sliding slots 111.

The sliding assembly 20 includes a main portion 21, at least one extending portion 22, at least one sliding member 23, at least one receiving portion 24, at least one fixing portion 25, and at least one elastic portion 26. A number of the extending portions 22 and a number of the sliding members 23 are both corresponding to a number of the sliding slots 111. In this embodiment, the sliding assembly 20 includes two extending portions 22 and two sliding members 23. The two extending portions 22 are positioned at two ends of the main portion 21 and form a U-shaped structure with the main portion 21. Each sliding member 23 is positioned at one end of the extending portion 22 away from the main portion 21 and is slidably assembled in one sliding slot 113.

Each sliding member 23 includes a first clamping portion 231, a second clamping portion 232, and a sliding portion 233. The first clamping portion 231 is positioned at one end of the extending portion 22 away from the main portion 21. The second clamping portion 232 is spaced from the first clamping portion 231. Two ends of the sliding portion 233 are respectively connected to the first clamping portion 231 and the second clamping portion 232. A width of the sliding portion 233 is less than a width of the first clamping portion 231 and a width of the second clamping portion 232, thus the first clamping portion 231, the second clamping portion 232, and the sliding portion 232 cooperatively form an H-shaped slot 234. When the sliding member 23 is assembled to the housing 10, the sliding portion 233 is received in the sliding slot 113. The first clamping portion 231 and the second clamping portion 232 are positioned at two sides of the sliding slot 113 and clamp with the end surface 11. Then, the sliding portion 233 slides in the sliding slot 113 and drives the sliding assembly 20 to move relative to the housing 10.

In at least one embodiment, a length of the second clamping portion 232 is greater than a length of the first clamping portion 231. One end of the second clamping portion 232 away from the extending portion 22 protrudes a latching portion 235. The latching portion 235 is configured to latch with the first latching slot 111 or the second latching slot 112 when the sliding assembly 20 slides relative to the housing 10, thereby fixing the sliding assembly 20.

In at least one embodiment, a number of the receiving portions 24, a number of the fixing portions 25, and a number of the elastic portions 26 are all corresponding to a number of the sliding slots 111. In this embodiment, the sliding assembly 20 includes two receiving portions 24, two fixing portions 25, and two elastic portions 26. Each receiving portion 24 is positioned at one end of the second clamping portion 232 away from the first clamping portion 231. Each receiving portion 24 defines a receiving hole 241 along an axial direction of the receiving portion 24. Each fixing portion 25 is positioned at a bottom wall of the top surface 13. The elastic portion 26 can be a spring, a torsion spring, or the like. The elastic portion 26 is sleeved on the fixing portion 25 with one end fixed on the fixing portion 25 and another end received in the receiving hole 241.

Figure 2:
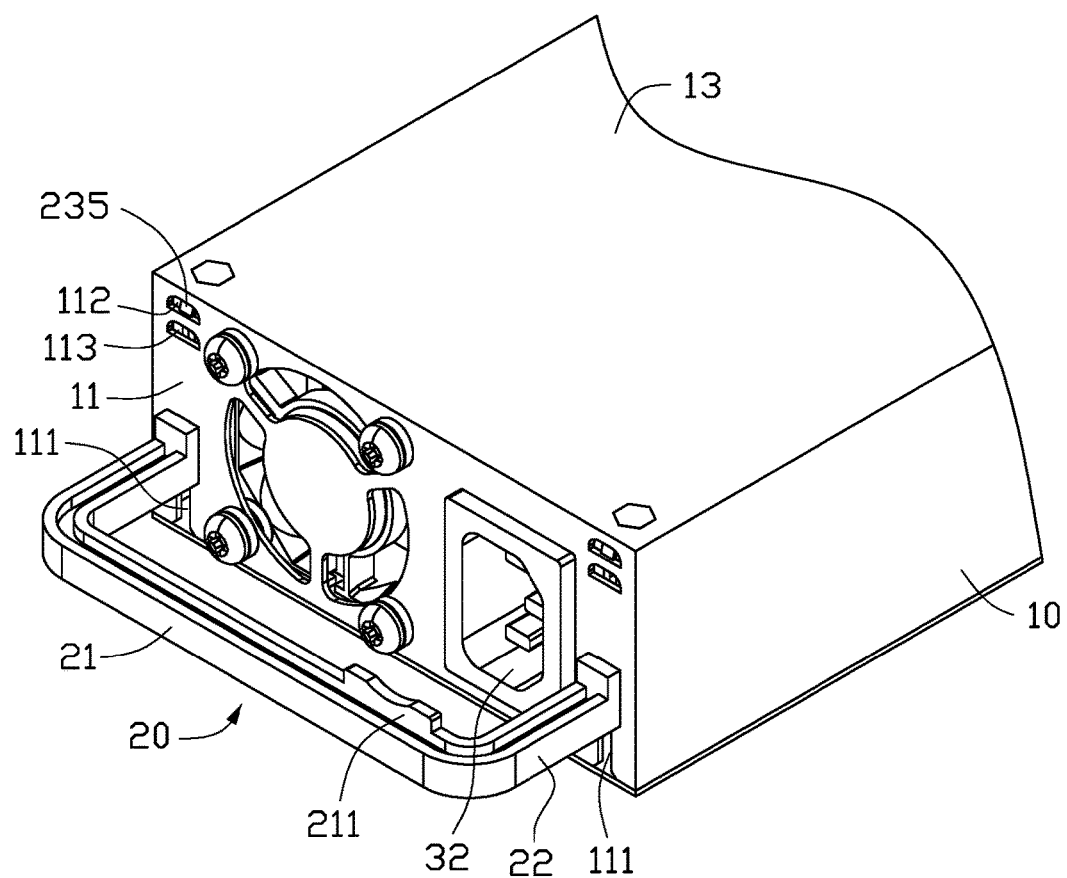
FIG. 2 is an isometric view of the power supply device, showing the power supply device in a first state.

FIG. 2 illustrates that when the sliding assembly 20 slides along the sliding slot 111 until the latching portion 235 is latched with the first latching slot 112, the sliding assembly 20 is in a first position and the elastic portion 26 is compressed. Then, the main portion 21 of the sliding assembly 20 blocks the power jack 32, which prevents the power plug 31 of the power assembly 30 from being inserted to the power jack 32.

Figure 3:
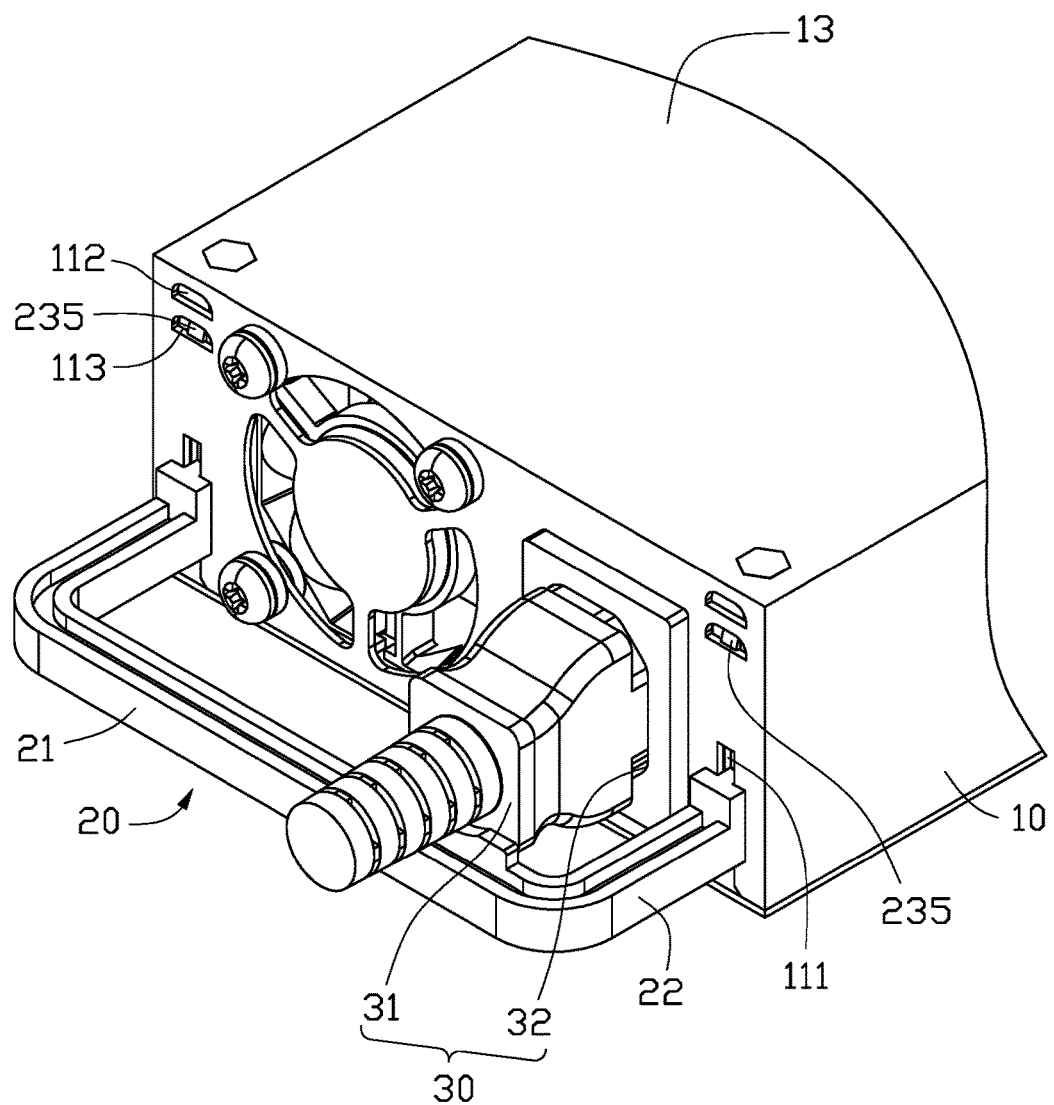
FIG. 3 is similar to FIG. 2, but showing the power supply device in a second state.

FIG. 3 illustrates that when the latching portion 235 is pressed to make the latching portion 25 to unlatch with the first latching slot 112. The elastic portion 26 restores the deformation and provides elasticity for driving the sliding assembly 20 to slide along the sliding slot 111 away from the top surface 13, the sliding assembly 20 is in a second position. Then, the main portion 21 of the sliding assembly 20 is not block the power jack 32 which allows the power plug 31 of the power assembly 30 to be inserted to the power jack 32.

It can be understood that, in other embodiments, the sliding assembly 20 further includes a resisting portion 211. The resisting portion 211 is positioned on the main portion 21. When the power plug 31 is inserted to the power jack 32, the sliding assembly 20 can further slide along the sliding slot 111 towards the top surface 13 until the latching portion 235 is latched with the second latching slot 112. Then, the sliding assembly 20 is in a third position and the resisting portion 211 can resist the power plug 31 for avoiding the power plug 31 falling down accidentally.

As illustrated in FIG. 1, in other embodiments, the sliding assembly 20 further includes a pressing portion 27 and the power supply device 100 includes a matching portion 50. The pressing portion 27 is positioned at one end of the receiving portion 24 away from the second sliding portion 232. The matching portion 50 is an elastic sheet and includes a fixing end 51 and a contacting end 52 opposite to the fixing end 51. The fixing end 51 is secured on a side of the housing 10. One side of the contacting end 52 includes a protruding portion 53. Another side of the contacting end 52 opposite to the protruding portion 53 forms a guiding portion 55 having an inclined guiding surface (not labeled).

Figure 4:
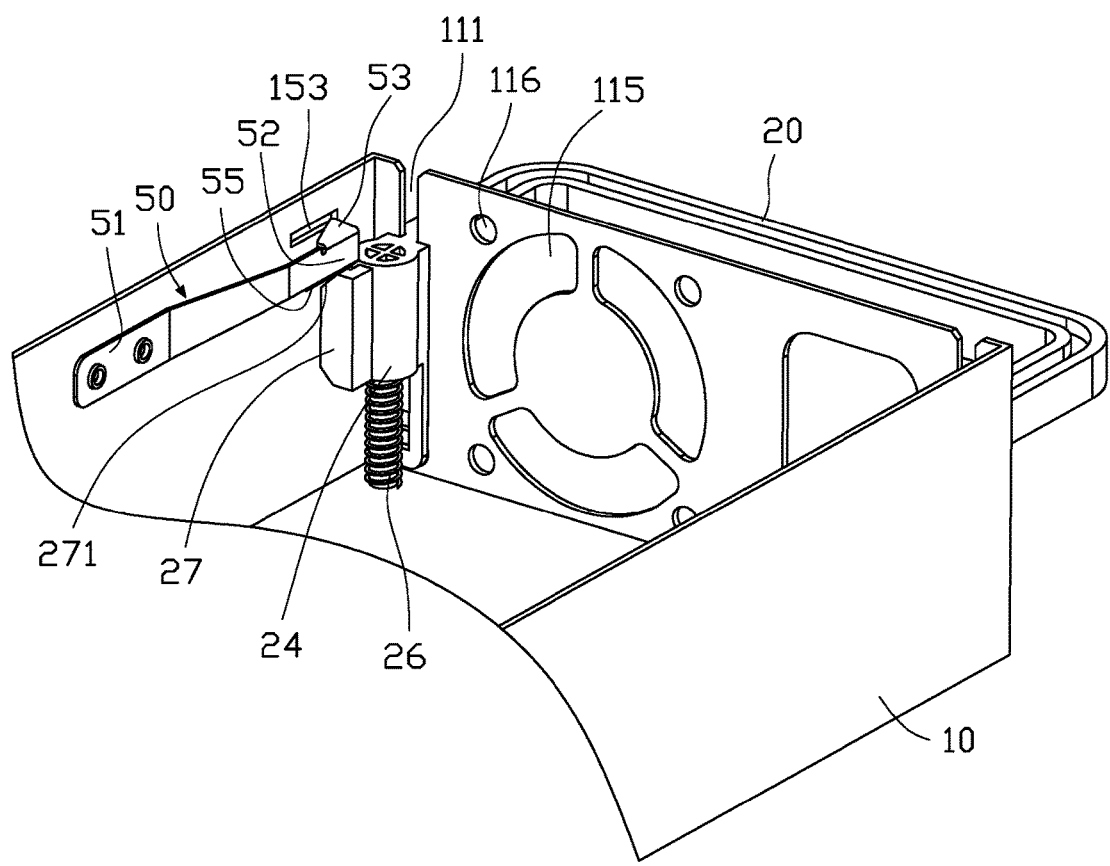
FIG. 4 is similar to FIG. 2, but showing at another angle.

FIG. 4 illustrates that the pressing portion 27 is substantially rectangular and one end of the pressing portion 27 forms an inclined pressing surface 271. One of the side surfaces 15 defines a matching slot 153. When the sliding assembly 20 is in the first position, the pressing surface 271 of the pressing portion 27 is spaced from the matching portion 50, that is, the pressing surface 271 of the pressing portion 27 does not contact with the inclined guiding surface of the guiding portion 55. Then, the protruding portion 53 is separated from the matching slot 153 and is not engaged with the matching slot 153.

Figure 5:
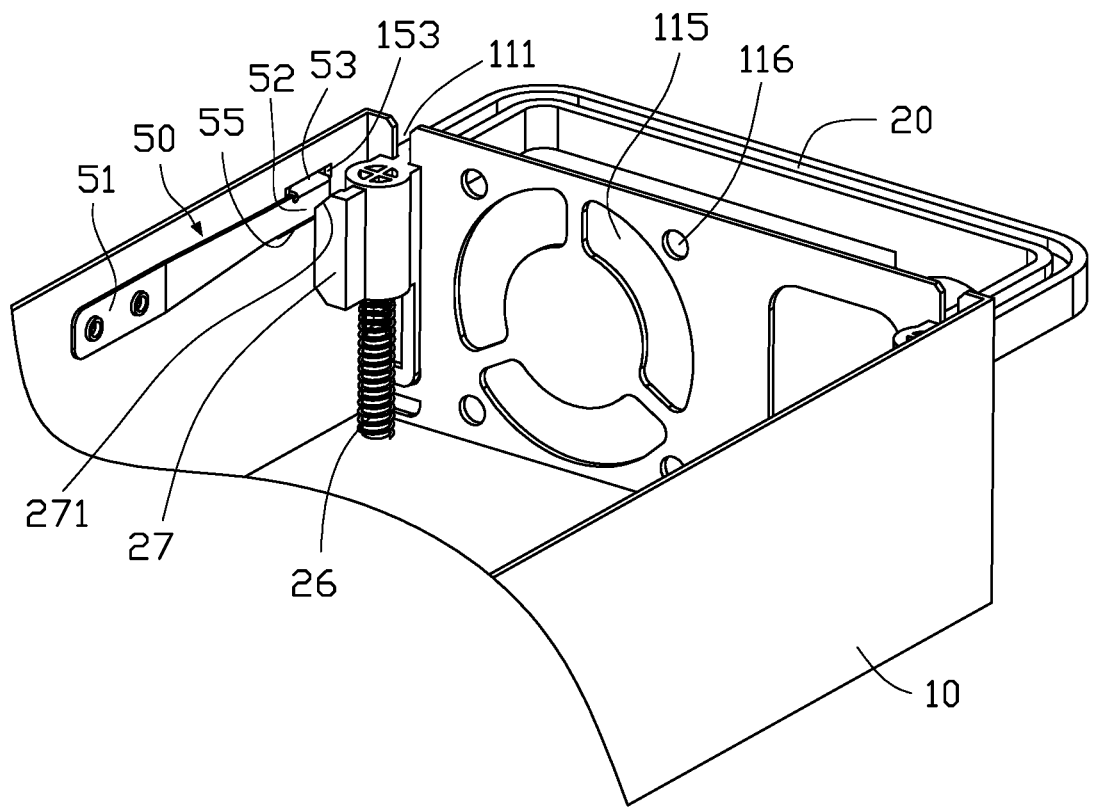
FIG. 5 is similar to FIG. 3, but showing at another angle.

FIG. 5 illustrates that when the sliding assembly 20 slides to the second position from the first position, the pressing portion 27 is gradually closed to the matching portion 50 until the pressing surface 271 of the pressing portion 27 contacts with the inclined guiding surface of the guiding portion 55. The pressing portion 27 slides along the guiding surface of the guiding portion 55 and presses the contacting end 52 of the matching portion 50. Then, the contacting end 52 is pressed by the pressing portion 27 and the protruding portion 53 moves towards the matching slot 153 until the protruding portion 53 passes through the matching slot 153 and exposes from one of the side surfaces 15.

As illustrated in FIG. 1, the power supply device 100 further includes a cover 60 and a fan 70. The cover 60 is secured below the housing 10 and is configured to match with the housing 10 to form a receiving space. The end surface 11 of the power supply device 100 further defines a fan hole 115 and at least one assembling hole 116. In this embodiment, there are four assembling holes 116 which are defined around the fan hole 115. The fan 40 is secured in the receiving space through at least one assembling member 80, such as screws, or the like, passing through the assembling hole 116.

Figure 6:
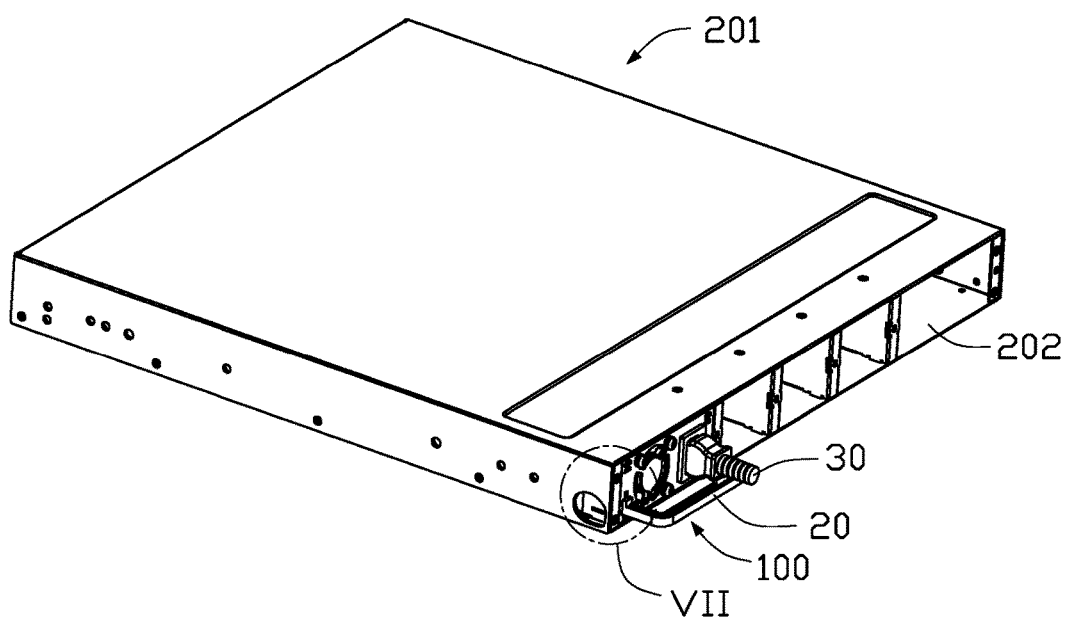
FIG. 6 is an isometric view of the power supply device applied to an electronic device.

FIG. 6 illustrates that the power supply device 100 can be applied to an electronic device 200, for example, a computer chassis. The electronic device 200 includes a case 201. The power supply device 100 can assembled in the case 201 from an end wall 202 of the case 201.

As illustrated, when the power supply device 100 is assembled to the electronic device 200, the sliding assembly 20 slides along the sliding slot 111 and the latching portion 235 is latched with the first latching slot 112, the sliding assembly 20 is in the first position and the elastic portion 26 is compressed. Then, the main portion 21 of the sliding assembly 20 blocks the power jack 32 which prevents the power plug 31 of the power assembly 30 from being inserted to the power jack 32. At the same time, the pressing surface 271 of the pressing portion 27 is spaced from the matching portion 50, that is, the pressing surface 271 of the pressing portion 27 does not contact with the inclined guiding surface of the guiding portion 55. The protruding portion 53 is separated from the matching slot 153 and is not engaged with the matching slot 153 which facilitates the power supply device 100 to be assembled in the case 201 from the end wall 202.

Figure 7:
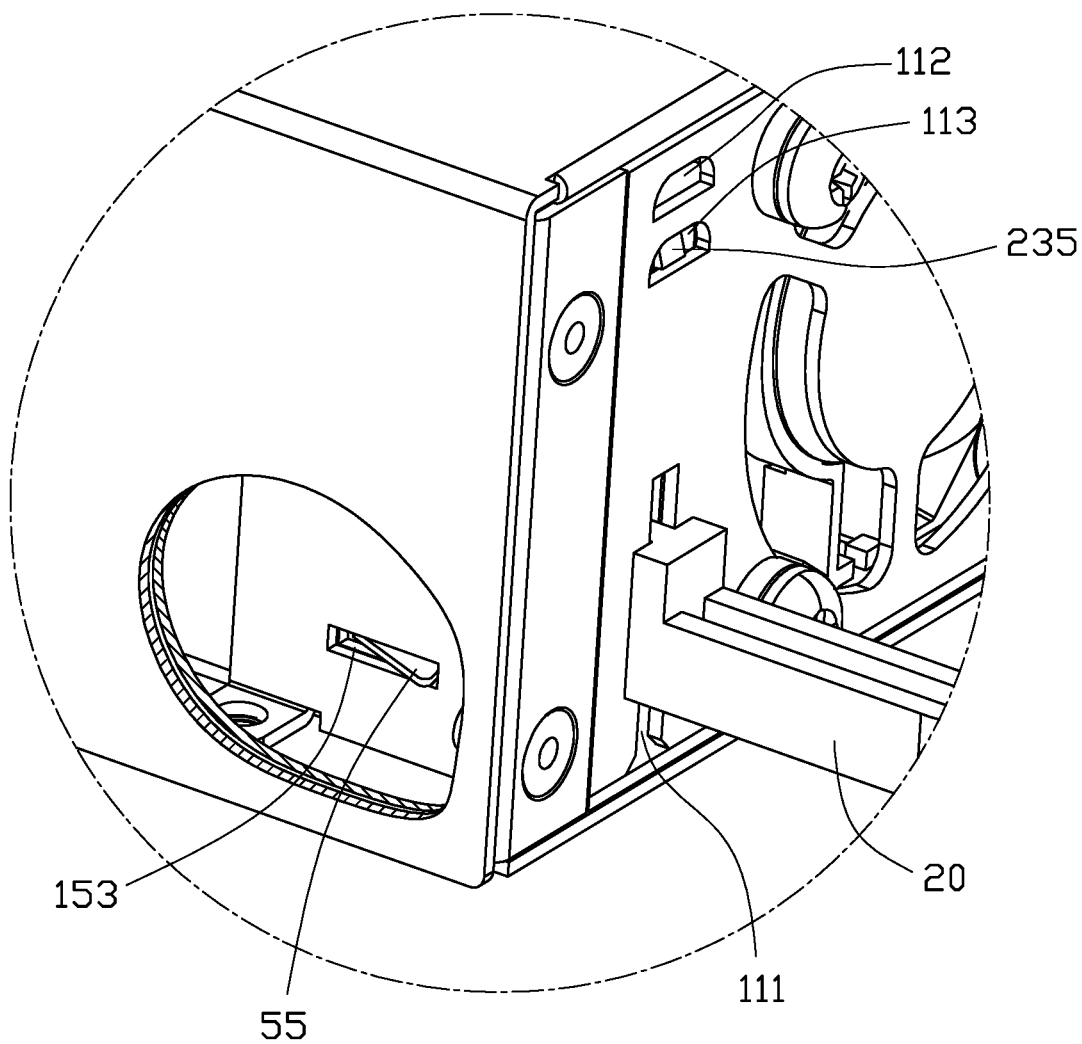
FIG. 7 is an enlarged view of a circular portion VII shown in FIG. 6.

When the power supply device 100 is assembled in the case 201, the latching portion 235 is pressed to make the latching portion 235 to unlatch with the first latching slot 112. The elastic portion 26 provides elasticity for driving the sliding assembly 20 to move along the sliding slot 111 until the sliding assembly 20 is in the second position. The main portion 21 of the sliding assembly 20 is not block the power jack 32, which allows the power plug 31 of the power assembly 30 to be inserted to the power jack 32. At the same time, the pressing surface 271 of the pressing portion 27 contacts with the inclined guiding surface of the guiding portion 55. The pressing portion 27 slides along the guiding surface of the guiding portion 55 and presses the contacting end 52 of the matching portion 50. Then, the contacting end 52 is pressed by the pressing portion 27 and the protruding portion 53 moves towards the matching slot 153 until the protruding portion 53 passes through the matching slot 153. As illustrated in FIG. 7, the contacting portion 53 is exposed from one of the side surfaces 15 which ensure that the power supply device 100 is firmly assembled in the electronic device 200 and cannot slide out from the case 201.

The power plug 31 of the power assembly 30 is inserted to the power jack 32. The sliding assembly 20 slides along the sliding slot 111 until the latching portion 235 is engaged with the second latching slot 113. Then, the sliding assembly 20 is in the third position and the resisting portion 211 resists the power plug 31 for avoiding the power plug 31 falling down accidentally.

The embodiments shown and described above are only examples. Many details are often found in the art such as the other features of the power supply device and the electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A power supply device comprising:
a housing defining at least one sliding slot;
a plug assembly comprising a power jack positioned on the housing and a power plug; and
a sliding assembly comprising a main portion, at least one extending portion, and at least one sliding member, the at least one extending portion is positioned at one end of the main portion, the at least one sliding member is positioned at one end of the extending portion away from the main portion and slidably mounted in the sliding slot, the sliding member partly slidably received in the sliding slot to make the sliding assembly to be slidably mounted on the housing;
wherein the sliding member comprises a first clamping portion, a second clamping portion, and a sliding portion, the first clamping portion is positioned at one end of the extending portion away from the main portion, the second clamping portion is spaced from the first clamping portion, two ends of the sliding portion are respectively connected to the first clamping portion and the second clamping portion, the sliding portion is slidably received in the sliding slot, the first clamping portion and the second clamping portion are positioned at two sides of the sliding slot;
wherein when the sliding assembly slides to a first position, the sliding assembly is configured to block the power jack for preventing the power plug being inserted to the power jack, and when the sliding assembly slides to a second position, the sliding assembly is configured to move away from the power jack for allowing the power plug being received in the power jack;
wherein the housing further defines at least one first latching slot, one end of the second clamping portion away from the extending portion protrudes a latching portion, and the latching portion is configured to latch with the first latching slot when the sliding assembly is in the first position.

2. The power supply device of claim 1, wherein the sliding member further comprises at least one receiving portion, at least one fixing portion, and at least one elastic portion, each receiving portion is positioned at one end of the second clamping portion away from the first clamping portion, each receiving portion defines a receiving hole, and each fixing portion is positioned at the housing, each elastic portion is sleeved on one fixing portion with one end fixed on the fixing portion and another end received in the receiving hole, the elastic portion is configured to provide elasticity for driving the sliding assembly to slide to the first positioned and the second position.

3. The power supply device of claim 1, wherein the housing further defines at least one second latching slot, the second latching slot is positioned between the sliding slot and the first latching slot, the second latching slot is configured to latch with the latching portion for fixing the sliding assembly in a third position when the power plug is received in the power jack and the sliding assembly slides along the sliding slot.

4. The power supply device of claim 3, wherein the sliding assembly further comprises a resisting portion, the resisting portion is positioned on the main portion, and the resisting portion is configured to resist the power plug when the sliding assembly is in the third position.

5. The power supply device of claim 3, further comprising a matching portion, wherein the sliding assembly further comprises a pressing portion, the matching portion comprises a fixing end and a contacting end opposite to the fixing end, the fixing end is secured on a side of the housing, one side of the contacting end comprises a protruding portion, the housing further defines a matching slot, when the sliding assembly is in the first position, the pressing portion does not contact with the contacting end and the protruding portion is not engaged with the matching slot; when the sliding assembly is in the second position and the third position, the pressing portion contacts with the contacting end, and the protruding portion passes through the matching slot and is exposed from one side of the housing.

6. The power supply device of claim 5, wherein another side of the contacting end opposite to the protruding portion forms a guiding portion having an inclined guiding surface, one end of the pressing portion forms an inclined pressing surface, and the guiding surface is configured to guide the pressing portion to slide.

7. The power supply device of claim 1, further comprising a cover and a fan, wherein the cover is secured below the housing, and the cover is configured to match with the housing for receiving the fan.

8. An electronic device comprising:
a case; and
a power supply device received in the case, the power supply device comprising:
a housing defining at least one sliding slot;
a plug assembly comprising a power jack positioned on the housing and a power plug; and
a sliding assembly comprising a main portion, at least one extending portion, and at least one sliding member, the at least one extending portion is positioned at one end of the main portion, the at least one sliding member is positioned at one end of the extending portion away from the main portion and slidably mounted in the sliding slot, the sliding member partly slidably received in the sliding slot to make the sliding assembly to be slidably mounted on the housing;

wherein the sliding member comprises a first clamping portion, second clamping portion, and a sliding portion, the first clamping portion is positioned at one end of the extending portion away from the main portion, the second clamping portion is spaced from the first clamping portion, two ends of the sliding portion are respectively connected to the first clamping portion and the second clamping portion, the sliding portion is slidably received in the sliding slot, the first clamping portion and the second clamping portion are positioned at two sides of the sliding slot;

wherein when the sliding assembly slides to a first position, the sliding assembly is configured to block the power jack for preventing the power plug being inserted to the power jack, and when the sliding assembly slides to a second position, the sliding assembly is configured to move away from the power jack for allowing the power plug being received in the power jack;

wherein the housing further defines at least one first latching slot, one end of the second clamping portion away from the extending portion protrudes a latching portion, and the latching portion is configured to latch with the first latching slot when the sliding assembly is in the first position.

9. The electronic device of claim 8, wherein the sliding member further comprises at least one receiving portion, at least one fixing portion, and at least one elastic portion, each receiving portion is positioned at one end of the second clamping portion away from the first clamping portion, each receiving portion defines a receiving hole, and each fixing portion is positioned at the housing, each elastic portion is sleeved on one fixing portion with one end fixed on the fixing portion and another end received in the receiving hole, the elastic portion is configured to provide elasticity for driving the sliding assembly to slide to the first positioned and the second position.

10. The electronic device of claim 8, wherein the housing further defines at least one second latching slot, the second latching slot is positioned between the sliding slot and the first latching slot, the second latching slot is configured to latch with the latching portion for fixing the sliding assembly in a third position when the power plug is received in the power jack and the sliding assembly slides along the sliding slot.

11. The electronic device of claim 10, wherein the sliding assembly further comprises a resisting portion, the resisting portion is positioned on the main portion, and the resisting portion is configured to resist the power plug when the sliding assembly is in the third position.

12. The electronic device of claim 10, further comprising a matching portion, wherein the sliding assembly further comprises a pressing portion, the matching portion comprises a fixing end and a contacting end opposite to the fixing end, the fixing end is secured on a side of the housing, one side of the contacting end comprises a protruding portion, the housing further defines a matching slot, when the sliding assembly is in the first position, the pressing portion does not contact with the contacting end and the protruding portion is not engaged with the matching slot; when the sliding assembly is in the second position and the third position, the pressing portion contacts with the contacting end, and the protruding portion passes through the matching slot and is exposed from one side of the housing.

13. The electronic device of claim 12, wherein another side of the contacting end opposite to the protruding portion forms a guiding portion having an inclined guiding surface, one end of the pressing portion forms an inclined pressing surface, and the guiding surface is configured to guide the pressing portion to slide.

14. The electronic device of claim 8, further comprising a cover and a fan, wherein the cover is secured below the housing, and the cover is configured to match with the housing for receiving the fan.

* * * * *